US012677595B2

(12) United States Patent
Sakuraba et al.

(10) Patent No.: US 12,677,595 B2
(45) Date of Patent: Jul. 7, 2026

(54) PELTIER ELEMENT WITH HEAT FLUX SENSOR

(71) Applicant: NATIONAL INSTITUTE FOR MATERIALS SCIENCE, Tsukuba (JP)

(72) Inventors: Yuya Sakuraba, Tsukuba (JP); Weinan Zhou, Tsukuba (JP); Natsuko Kojima, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 18/865,934

(22) PCT Filed: May 10, 2023

(86) PCT No.: PCT/JP2023/017609
§ 371 (c)(1),
(2) Date: Nov. 14, 2024

(87) PCT Pub. No.: WO2023/223920
PCT Pub. Date: Nov. 23, 2023

(65) Prior Publication Data
US 2025/0311632 A1 Oct. 2, 2025

(30) Foreign Application Priority Data
May 16, 2022 (JP) ................................ 2022-079882

(51) Int. Cl.
*H10N 19/00* (2026.01)
*G01K 17/00* (2006.01)
(52) U.S. Cl.
CPC ............. *H10N 19/00* (2023.02); *G01K 17/00* (2013.01)

(58) Field of Classification Search
CPC ....... H10N 15/00–20; H10N 52/00–85; H10N 10/00–857
See application file for complete search history.

(56) References Cited

U.S. PATENT DOCUMENTS

2014/0209142 A1 * 7/2014 Hayakawa ............. H10N 15/00
136/205
2020/0037884 A1 2/2020 Ishida et al.

FOREIGN PATENT DOCUMENTS

JP 2003-46144 A 2/2003
JP 2003-174203 A 6/2003
JP 2003-282796 A 10/2003
(Continued)

OTHER PUBLICATIONS

Office Action dated Jul. 8, 2025 in Japanese Application No. 2024-521703.
(Continued)

*Primary Examiner* — Ryan S Cannon
(74) *Attorney, Agent, or Firm* — SALIWANCHIK, LLOYD & EISENSCHENK

(57) ABSTRACT

Provided is a Peltier element with an ultra-low thermal resistance heat flux sensor that is capable of detecting heat flow passing through the Peltier element at high speed and has negligible thermal resistance. It has a structure in which an anomalous Nernst heat flux sensor is formed directly on one or both of an upper part and a lower part of an insulating board that forms a Peltier element.

8 Claims, 4 Drawing Sheets

<u>100</u>

(56)　　　　　References Cited

FOREIGN PATENT DOCUMENTS

| JP | 2006-133067 A | 5/2006 |
|----|---------------|--------|
| JP | 2012-242347 A | 12/2012 |
| JP | 2019-130271 A | 8/2019 |
| JP | 2021-136436 A | 9/2021 |
| JP | 2022-041249 A | 3/2022 |

OTHER PUBLICATIONS

Zhou, W. et al., "Heat flux sensing by anomalous Nernst effect in Fe—Al thin films on a flexible substrate," Applied Physics Express, Mar. 9, 2020, 13:1-6, The Japan Society of Applied Physics.
Osawa, Y. et al., "Control of Thermal Conductance with Detection of Single Contacting Part for Rendering Thermal Sensation," IEEJ Journal of Industry Applications, 2016, 5(2): 101-107, The Institute of Electrical Engineers of Japan.
International search Report and Written Opinion dated Aug. 1, 2023 in International Application No. PCT/JP2023/017609.

* cited by examiner

100

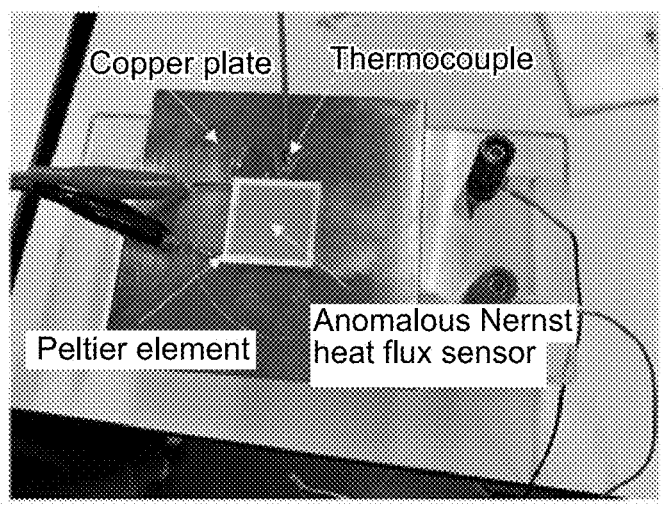
FIG.4
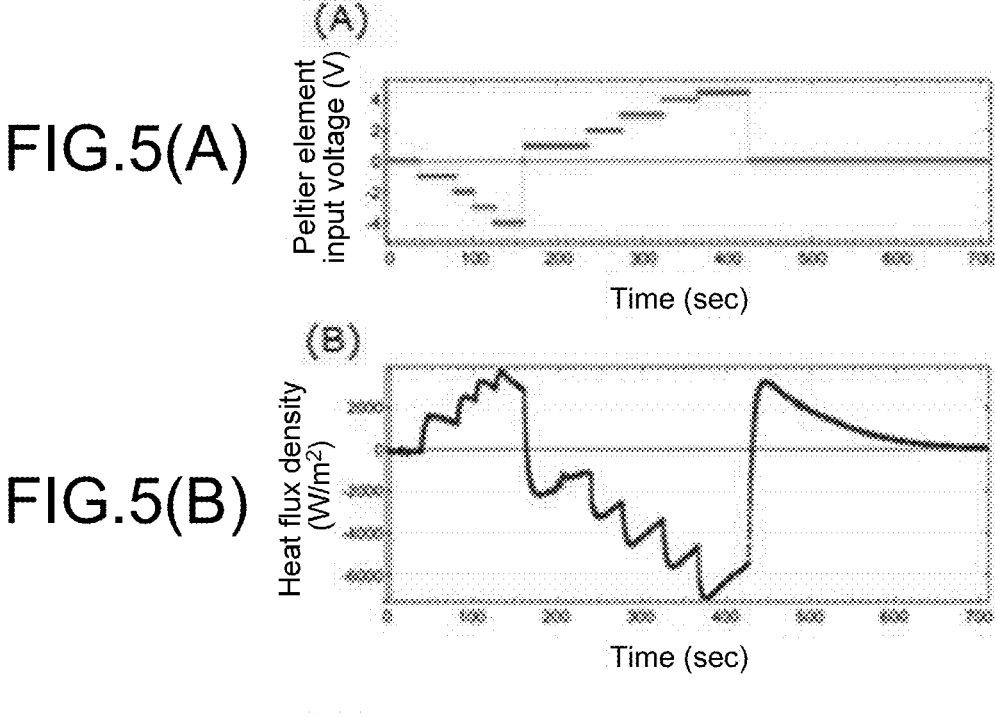
FIG.5(A)
FIG.5(B)
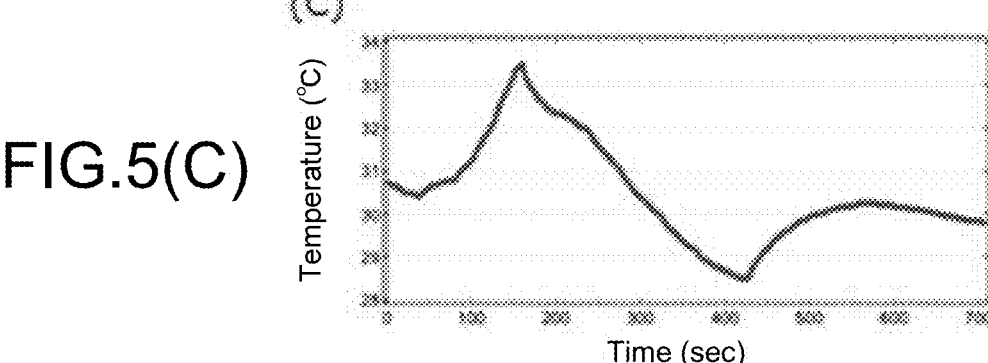
FIG.5(C)

FIG.6(A)
(A) Seebeck effect
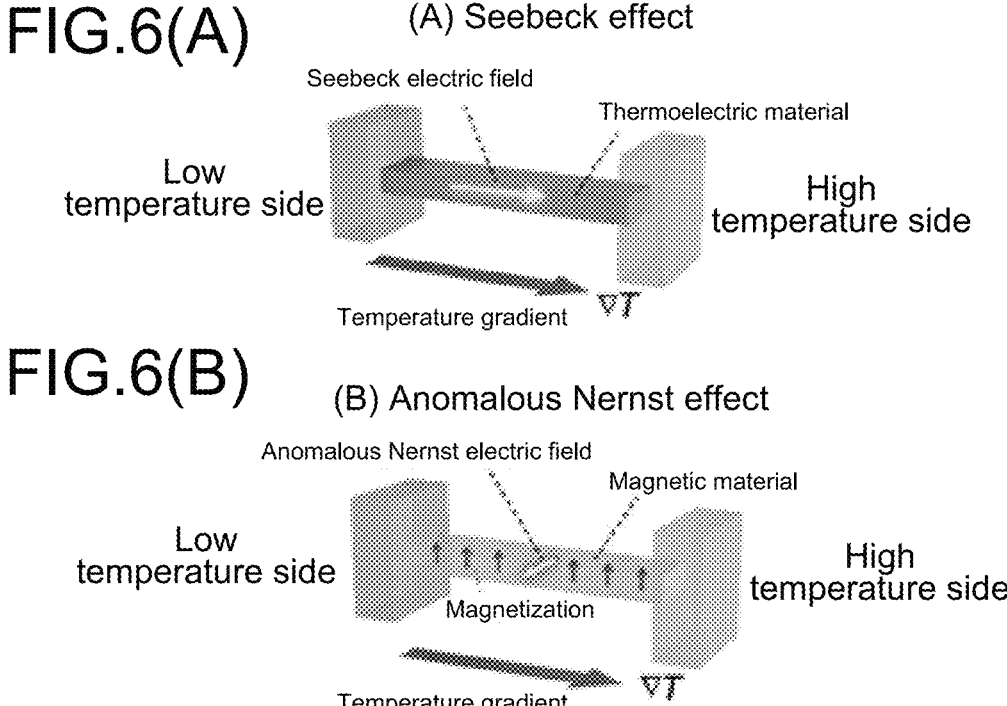
FIG.6(B)
(B) Anomalous Nernst effect
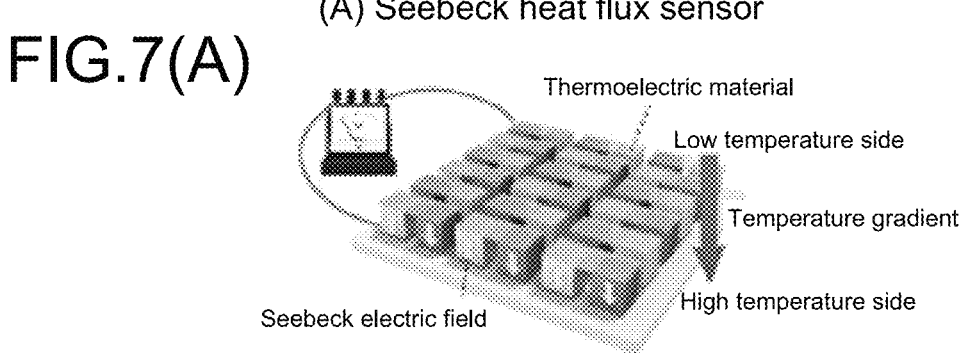
(A) Seebeck heat flux sensor
FIG.7(A)
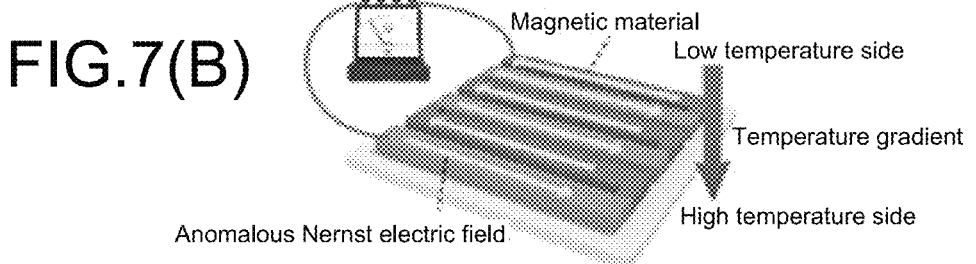
(B) Anomalous Nernst heat flux sensor
FIG.7(B)

1

PELTIER ELEMENT WITH HEAT FLUX SENSOR

CROSS-REFERENCE TO RELATED APPLICATIONS

This application is the U.S. national stage application of International Patent Application No. PCT/JP2023/017609, filed May 10, 2023, which claims the benefit under 35 U.S.C. § 119 of Japanese Application No. 2022-079882, filed May 16, 2022, the disclosures of each of which are incorporated herein by reference in their entirety.

TECHNICAL FIELD

The present invention relates to a Peltier element with a heat flux sensor.

Background Art

The Seebeck effect that is a general thermoelectric effect is a phenomenon in which an electric field is generated in a direction parallel to a temperature gradient when the temperature gradient is applied to a substance having conductivity (FIG. 6(A)).

A Seebeck-type heat flux sensor has a structure in which thermoelectric materials having positive and negative Seebeck coefficients are alternately aligned and a series connection is made above and below the direction of the temperature gradient caused by the heat flow passing through the sensor (FIG. 7(A)). Heat flux sensors using the Seebeck effect have already been commercialized and commercially available, but have a problem of limited applications due to various issues such as their complex structures, high thermal resistance, low flexibility, and high cost.

Meanwhile, the anomalous Nernst effect that occurs in a magnetic material is characterized by the appearance of an electric field in a direction orthogonal to the temperature gradient caused by the heat flow passing through the sensor and the magnetization of the magnetic material (FIG. 6(B)).

In recent years, the present inventors have demonstrated that a special thermoelectric effect, the "anomalous Nernst effect", which occurs in a magnetic material, can be used to amplify the voltage with an extremely simple structure connected in an in-plane direction and function as a heat flux sensor [see Non-Patent Literature 1]. The anomalous Nernst-type heat flux sensor has, for example, a structure in which magnetic wires extend in a direction perpendicular to the temperature gradient are connected in series (FIG. 7(B)).

This anomalous Nernst-type heat flux sensor is expected to have low thermal resistance, high flexibility, and low production cost, because it can be formed on an extremely thin flexible sheet.

Meanwhile, the Peltier effect (phenomenon in which heat flows when a current is caused to flow and the direction of heat flow changes depending on the direction of the current) that is the opposite effect of the Seebeck effect is used in a rare device that is capable of heating and cooling an object with a single module and is widely used in a Peltier cooler, CCD cooling, CPU cooling, temperature control of a silicon wafer in production of a semiconductor chip, a device for culturing microorganisms, a thermal sensing device, and the like [see, for example, Patent Literatures 1 and 2]. Since the Peltier element is a device that controls the flow of heat, it would be possible to, for example, control temperature with higher accuracy if the flow of heat by the Peltier element can be quantitatively detected and controlled. Further, attempts have been made to, for example, control the temperature sensation of a human body using the Peltier element [see Non-Patent Literature 2], and it is expected that the temperature sensation can be controlled with higher accuracy by the heat flow detection.

CITATION LIST

Patent Literature

Patent Literature 1 Japanese Patent Application Laid-open No. 2003-46144
Patent Literature 2 Japanese Patent Application Laid-open No. 2003-282796

Non-Patent Literature

Non-Patent Literature 1 W. Zhou et al., Appl Phys. Express 13, 043001 (2020).
Non-Patent Literature 2 Yukiko Osawa, et al., "Control of Thermal Conductance with Detection of Single Contacting Part for Rendering Spatial Sensation," IEEJ Journal of Industry Applications, vol. 5, no. 2, pp. 101-107, March 2016

DISCLOSURE OF INVENTION

Technical Problem

However, the density of heat flow passing through the Peltier element is not determined only by the magnitude and orientation of the current flowing, but depends on a complex thermal circuit including thermal boundary conditions on the cooling and heating sides, so that it is not easy to quantitatively measure how much the Peltier element generates heat flow.

In the case where the above Seebeck heat flux sensor is attached to a Peltier element to measure heat flow, its thermal resistance is too large, i.e., approximately $10^{-1}$ to $10^{-2}$ m$^2$K/W so that the use of the heat flux sensor significantly impairs the cooling and heating efficiency of the Peltier element. Therefore, there is a problem that the use of the Seebeck heat flux sensor is not practical.

Meanwhile, a heat flux sensor using the anomalous Nernst effect is a known device [see, for example, Non-Patent Literature 1] and has been prepared on an insulating board of Si with a thermally oxidized film, MgO, or the like or a flexible extremely thin sheet of polyimide, polyethylene naphthalate, or the like. Since the magnetic thin film contributes to thermoelectric conversion, the sensor has thermal resistance of $10^{-3}$ to $10^{-6}$ m$^2$K/W, which is 1 to 4 orders smaller than that of the Seebeck-type heat flux sensor. However, even in this case, it has a problem that when being attached to a Peltier element for use, occurrence of thermal resistance that reduces the efficiency of heat flow control cannot be avoided.

The present invention has been made to solve the above-mentioned problem and aims to provide a Peltier element with an ultra-low thermal resistance heat flux sensor that is capable of detecting heat flow passing through the Peltier element at high speed and has negligible thermal resistance.

Solution to Problem (1) A Peltier element with a heat flux sensor according to the present invention has a structure in which an anomalous Nernst heat flux sensor 20 is formed directly on one or both of an upper part and a lower part of an insulating board that forms a Peltier element 10, as shown in FIG. 1, for example.

(2) In the Peltier element with a heat flux sensor (1) according to the present invention, favorably, the Peltier element may sandwich PN junction elements between insulating boards and include an electrode on the insulating board, and an electrode provided on a bottom surface in a package and the electrode of the Peltier element may be caused to abut on each other to be directly connected as shown in FIG. 2, for example.

(3) In the Peltier element with a heat flux sensor (2) according to the present invention, favorably, the insulating board may be either a ceramic board or a flexible sheet.

(4) In the Peltier elements with a heat flux sensor (1) to (3) according to the present invention, favorably, the anomalous Nernst heat flux sensor may include a thermoelectric generator 22 including a plurality of fine lines 22a that is arranged parallel to each other (y direction) along a surface of an insulating board 21 and a connector 23 including a plurality of fine lines 23a that is arranged parallel to the fine lines 22a of the thermoelectric generator 22 and between the fine lines 22a, > each of the fine lines 22a of the thermoelectric generator 22 may be formed of a magnetic material having residual magnetization even in absence of an external magnetic field and is magnetized in the same direction (x direction), and each of the fine lines 23a of the connector 23 may electrically connect one end of the corresponding fine line 22a of the thermoelectric generator 22 to another end of a fine line 22a adjacent to the corresponding fine line 22a on one side, and
>
> the connector 23 may be formed of a magnetic material that is magnetized in a direction opposite to a direction of magnetization of each of the fine lines 22a, a magnetic material that has a Nernst coefficient with an opposite sign to that of each of the fine lines 22a, or a non-magnetic material, as shown in FIGS. 3(A)-3(C), for example.

(5) In the Peltier element with a heat flux sensor (4) according to the present invention, favorably, the magnetic material of each of the fine lines 22 and 23 may be any of Fe—Al, Fe—Ga, Fe—Sn, Fe—Pt, Mn—Ga, Mn—Ge, Mn—Sn, Ni—Pt, Co—Gd, $Fe_4N$, $Mn_3AN$ (A=Mn, Pt, Ni), a $Co_2YZ$ (Y=Ti, V, Cr, Mn, Fe, Z=Ga, Ge, Al, Si, Sn, Sb) Heusler alloy, an Sm—Co permanent magnet material, an Nd—Fe—B permanent magnet material, an FePt $L1_0$ ordered alloy, an FePd $L1_0$ ordered alloy, and a CoPt $L1_0$ ordered alloy.

(6) In the Peltier element with a heat flux sensor (4) according to the present invention, favorably, the non-magnetic material may be any of Cu, Ag, Au, Al, Rh, W, Mo, Pt, Pd, and an alloy material containing these.

(7) The Peltier elements with a heat flux sensor (1) to (6) according to the present invention may favorably further include a heat-dissipating fin attached onto the Peltier element.

Advantageous Effects of Invention

In the present invention, a metal thin film (a plurality of fine lines that forms an anomalous Nernst heat flux sensor) having a thickness of several tens to several thousands of nm is directly formed on a Peltier element and patterned, so that its thermal resistance is extremely low, i.e., $10^{-8}$ to $10^{-10}$ $m^2K/W$ and does not affect the cooling or heating efficiency of the Peltier element at all, making it possible to measure the density of heat flow passing through the Peltier element in real time at high speed. Since the heat low is detected on the basis of the anomalous Nernst effect that is a thermoelectric effect, no external power supply is required and measurement can performed by measuring the voltage at two terminals.

BRIEF DESCRIPTION OF DRAWINGS

FIG. 4 is a perspective view of a configuration of an experimental device in which the anomalous Nernst heat flux sensor is patterned on an upper part of the Peltier element showing Example of the present invention, showing measurement of the heat flow and temperature by a thermocouple attached to a copper plate.

FIGS. 5(A)-5(C) are diagrams showing a result of measuring the heat flow and temperature by a thermocouple attached to a copper plate when the anomalous Nernst heat flux sensor is patterned on an upper part of the Peltier element showing Example of the present invention and the voltage input to the Peltier element is changed. FIG. 5(A) shows the current input to the Peltier element, FIG. 5(B) shows the detected density of heat flow, and FIG. 5(C) shows the change in the detected temperature over time.

FIG. 6(A) is an explanatory diagram of the Seebeck effect, and FIG. 6(B) is an explanatory diagram of the anomalous Nernst effect.

FIG. 7(A) is an explanatory diagram of a Seebeck-type heat flux sensor, and FIG. 7(B) is an explanatory diagram of an anomalous Nernst-type heat flux sensor.

MODE(S) FOR CARRYING OUT THE INVENTION

Figure 1:
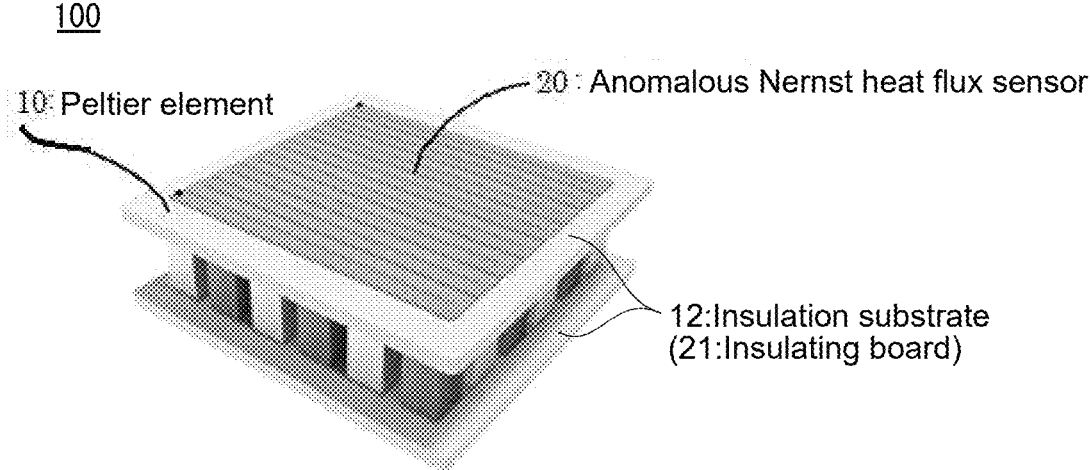
FIG. 1 is a perspective view of a configuration of a Peltier element with a heat flux sensor showing an embodiment of the present invention.

The best mode for carrying out the present invention will be described below in detail. Note that the upper and lower limit values of "to" indicating a range include the boundary values unless otherwise stated. That is, for example, "AA to BB" indicates AA or more and BB or less.

Overview of Peltier Element with Heat Flux Sensor
100

A Peltier element with a heat flux sensor 100 according to an embodiment of the present invention is characterized by using a single substrate that serves both as an insulation substrate 12 that forms a Peltier element 10 and an insulating board 21 that forms an anomalous Nernst heat flux sensor 20.

FIG. 1 is a perspective view of a configuration of the Peltier element with a heat flux sensor 100 according to an embodiment of the present invention. The Peltier element with a heat flux sensor 100 has a structure in which the anomalous Nernst heat flux sensor 20 is directly formed on one or both of the upper part and the lower part of the insulating board 21 (insulation substrate 12) of the Peltier element 10 (i.e., at least one of a heat absorbing surface or a heat generating surface of the Peltier element 10). The anomalous Nernst heat flux sensor 20 is also called a thermoelectric conversion element or a thermoelectric power generation device due to its physical effect.

The basic configuration of the Peltier element with a heat flux sensor 100 according to an embodiment of the present invention is similar to those of the Peltier element 10 and the anomalous Nernst heat flux sensor 20 alone according to Reference Example described below.

Each of the Peltier element 10 and the anomalous Nernst heat flux sensor 20 (hereinafter, also referred to simply as a "heat flux sensor 20") will be described below.

Configuration of Single Body According to Reference Example

Peltier Element 10 According to Reference Example

The Peltier element 10 typically includes a pair of insulation substrates 12 facing each other, which have a pair of outer surfaces 12a and a pair of inner surfaces 12b, a plurality of N-type elements 11N and a plurality of P-type elements 11P (PN junction elements) sandwiched between the pair of inner surfaces 12b of the pair of insulation substrates 12, and a pair of electrode patterns 15 formed on the inner surfaces 12b of the pair of insulation substrates 12 such that the N-type and P-type elements 11N and 11P are alternately connected in series.

Figure 2:
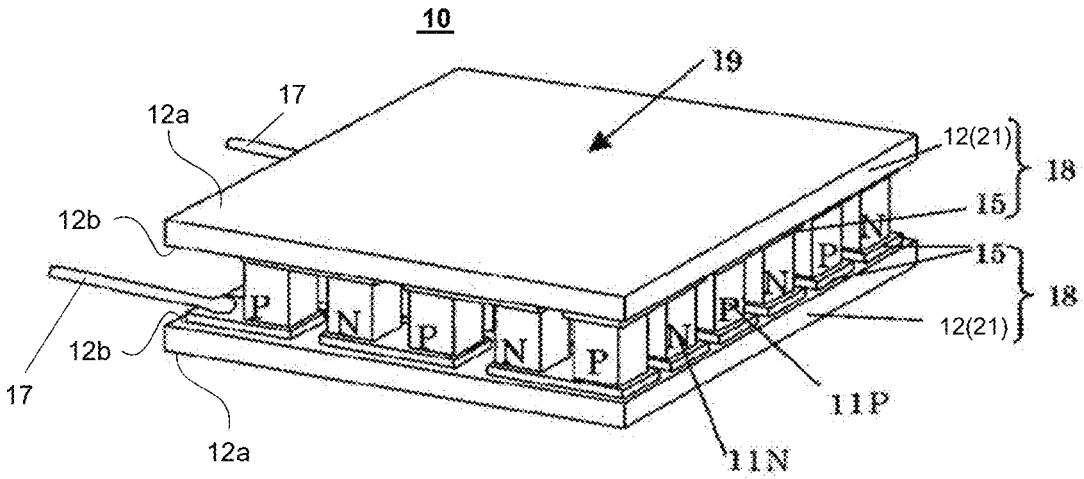
FIG. 2 is a perspective view of a configuration of an entire heat/cold module using the Peltier element.

FIG. 2 is a perspective view of a configuration of an entire heat/cold module 19 using the Peltier element 10. The Peltier element 10 that is a thermoelectric conversion element is an element in which P-type elements formed of a P-type semiconductor and N-type elements formed of an N-type semiconductor are alternately electrically connected and a cooling/heat generation effect called the Peltier effect occurs at the junction between the P-type element and the N-type element when energized. This Peltier element 10 is usually used as the heat/cold module 19 equipped with a plurality of P-type elements 11P and a plurality of N-type elements 11N for cooling/temperature control of a semiconductor apparatus or the like. In such a Peltier element 10 used in the heat/cold module 19, the outer surfaces 12a of the pair of insulation substrates 12 are configured as a heat absorbing surface and a heat generating surface.

For example, as shown in FIG. 2, the heat/cold module 19 is configured by sandwiching the plurality of N-type elements 11N and the plurality of P-type elements 11P between a pair of wiring boards for mounting a Peltier element 18 each including the insulation substrate 12 and the electrode pattern 15 formed on the inner surface 12b of this insulation substrate 12, and the N-type elements 11N and the P-type elements 11P are sandwiched on the electrode patterns 15 such that they are alternately aligned electrically in series and thermally in parallel.

Further, the heat/cold module 19 may have a configuration in which an electrode (electrode pattern 15) provided on the bottom surface (inner surface 12b of the insulation substrate 12) in the package and an electrode that is an external terminal of the Peltier element 10 are caused to abut on each other to be directly connected. That is, the Peltier element 10 may include an electrode for external connection 17 to be connected to one of the pair of electrode patterns 15, which may be an external configuration.

Further, the insulation substrate 12 is responsible for holding the N-type and P-type elements 11N and 11P, wiring between the N-type and P-type elements 11N and 11P, and exchanging heat between the N-type and P-type elements 11N and 11P and a semiconductor apparatus (not shown), a heat dissipation board (not shown), or the like mounted on the heat/cold module 19.

For the pair of insulation substrates 12, ceramics such as an aluminum nitride sintered body and an alumina sintered body having excellent thermal conductivity are used. Note that in order to reduce the thermal resistance of the insulation substrate 12 and increase the heat exchange efficiency of the heat/cold module 19, as the ceramics used for the insulation substrate 12, an aluminum nitride sintered body that can be made thin and has high thermal conductivity is increasingly used.

The Peltier element 10 utilizes the Peltier effect in which when a current is caused to flow through two types of metal joined together, heat is generated and absorbed on the respective metal surfaces. Currently, a P-type semiconductor and an N-type semiconductor are used instead of metals. Such heat conversion occurs on the junction surface between the P-type semiconductor and the N-type semiconductor similarly. Since it is necessary to take in energy from the outside in order for electrons to move from the P-type semiconductor with a low energy level to the N-type semiconductor with a high energy level, the heat is absorbed (on one of the outer surfaces 12a of the Peltier element 10) at this time, which allows the temperature to be lowered.

Examples of a general thermoelectric material used for a semiconductor forming the N-type and P-type elements 11N and 11P include bismuth telluride, lead telluride, silicon germanium, and a bismuth-antimony alloy. Of these, bismuth telluride is the most commonly used.

Heat Flux Sensor 20 According to Reference Example

Figures 3A, 3B, 3C:
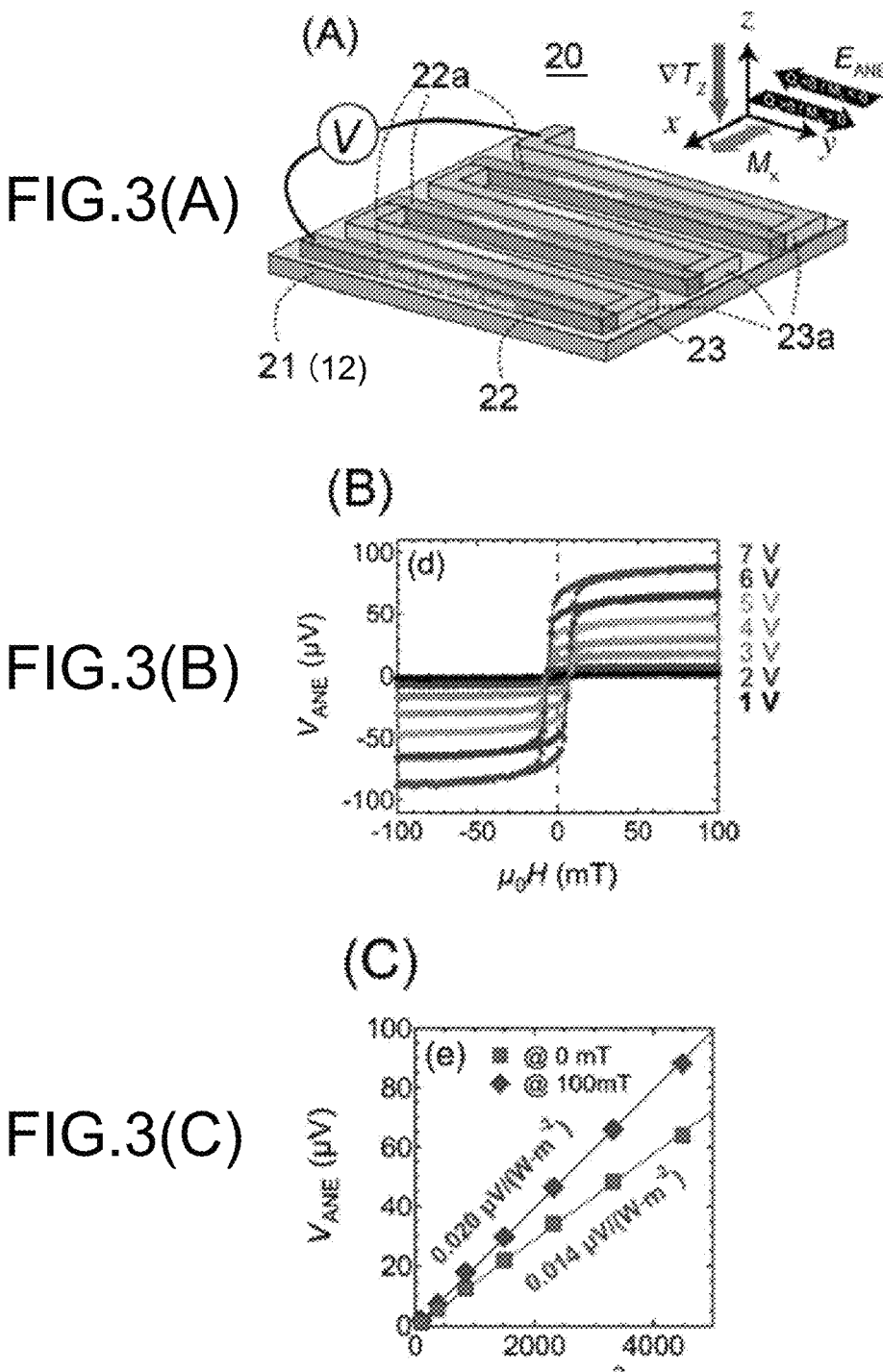
FIG. 3(A) is a perspective view showing a basic structure of a heat flux sensor using the anomalous Nernst effect used in the present invention.
FIG. 3(B) shows an example of an evaluation result of an anomalous Nernst heat flux sensor and shows a change in the anomalous Nernst voltage output when the density of heat flow in a z direction is changed with respect to an external magnetic field.
FIG. 3(C) shows the dependence of the anomalous Nernst voltage on the density of heat flow.

FIGS. 3(A)-3(C) are perspective views showing a conceptual configuration for describing the heat flux sensor 20 (thermoelectric conversion device) based on the anomalous Nernst effect used in the present invention and is a perspective view showing a basic structure of the heat flux sensor 20 (thermoelectric power generation device) utilizing the anomalous Nernst effect. As shown in FIGS. 3(A)-3(C), the heat flux sensor 20 includes the insulating board 21, a thermoelectric generator 22, and a connector 23.

At least the surface layer of the insulating board 21 is generally formed of an electrical insulator. The insulating board 21 is formed of, for example, a ceramic material such as aluminum nitride, or includes a silicon board with a thermal oxide film or an MgO single crystal board.

The thermoelectric generator 22 includes a plurality of fine lines 22a (i.e., narrow lines) that extends in the y direction (first direction) along the surface (xy plane) of the insulating board 21 and is arranged parallel to each other in the x direction (second direction) orthogonal to the y direction. Each fine line 22a is a magnetic material having residual magnetization (i.e., having magnetization even in the absence of application of an external magnetic field) and is magnetized in the same direction in the x direction (width direction of the fine line 22a).

In the specific example of the anomalous Nernst heat flux sensor 20 prepared on the board shown in FIGS. 3(A) and 3(B), each fine line 22a is formed by thinning a thin FeAl film deposited on a flexible sheet (insulating board 21) and is formed of a magnetic material having residual magnetization in the width direction (x direction) of the fine line 22a. The thermoelectric generator 22 is configured to generate power in a direction (y direction) orthogonal to the magnetization direction (x direction) and the temperature difference direction (z direction) of the fine line 22a by the anomalous Nernst effect, which generates a temperature difference in a direction (z direction: thickness direction of the insulation substrate 12) orthogonal to the magnetization direction (x direction) of the fine line 22a.

Note that examples of the magnetic material of the thermoelectric generator 22 include a magnetic material having positive thermoelectric power, such as Fe—Al, Fe—Ga, Fe—Sn, Fe—Pt, Mn—Sn, a $Co_2YZ$ (Y=Ti, V, Cr, Mn, Fe, Z=Ga, Ge, Al, Si, Sn, Sb) Heusler alloy, an Sm—Co permanent magnet material, an FePt $L1_0$ ordered alloy, an FePd $L1_0$ ordered alloy, a CoPt $L1_0$ ordered alloy, and a magnetic material having negative thermoelectric power, such as Mn—Ga, Mn—Ge, and a Nd—Fe—B permanent magnet material. However, it has been found that the sign of the thermoelectric power is not determined only from the elemental composition of the above materials. That is, even in the same material system, the sign of the thermoelectric power is positive and negative (e.g., in the case of Fe—Ga, negative in the case where the concentration of Ga is low). In this case, the combination of magnetic materials only needs to be determined with priority given to the cases where the sign of thermoelectric power is positive and negative.

The connector 23 has a configuration for connecting the plurality of fine lines 22a in series such that a current flows in the same orientation in the y direction (first direction) through the plurality of fine lines 22a of the thermoelectric generator 22.

For example, the connector 23 includes a plurality of fine lines 23a (i.e., narrow lines) arranged parallel to the fine lines 22a of the thermoelectric generator 22 and between the fine lines 22a along the surface (xy plane) of the insulating board 21. Then, each of the fine lines 23a of the connector 23 is configured to electrically connect one end of a first fine line and the other end of a second fine line, the first fine line and the second fine line being fine lines 22a of the thermoelectric generator 22 adjacent to each other. This allows the connector 23 to electrically connect the fine lines 22a of the thermoelectric generator 22 in series.

However, the connector 23 does not necessarily need to have the above configuration as long as the fine lines 22a of the thermoelectric generator 22 can be electricity connected in series such that a current flows in the same orientation.

In the case where the connector 23 is formed of a magnetic material (e.g., a ferromagnetic material) having the same sign of the Nernst coefficient as that of the thermoelectric generator 22, the detection sensitivity can be increased by magnetizing the connector 23 in the magnetization direction opposite to the magnetization direction of the thermoelectric generator 22 (in the x direction) (i.e., forming the connector 23 of a magnetic material having residual magnetization opposite to the residual magnetization direction of the thermoelectric generator 22). In the case where the connector 23 is formed of a magnetic material (e.g., a ferromagnetic material) having a Nernst coefficient with an opposite sign to that of the thermoelectric generator 22, the detection sensitivity can be increased by magnetizing the connector 23 in the same magnetization direction as the magnetization direction of the thermoelectric generator 22 (in the x direction) (i.e., forming the connector 23 of a magnetic material having residual magnetization in the same direction as the residual magnetization direction of the thermoelectric generator 22). For the connector 23, a non-magnetic material that provides electrical connection can also be used. In the specific example shown in FIGS. 3(A) and 3(B), the connector 23 is formed of Au that is a non-magnetic material.

FIG. 3(B) shows a change in the anomalous Nernst voltage output when the density of heat flow in the z direction (thickness direction of the insulating board 21) is changed with respect to an external magnetic field. FIG. 3(C) shows the dependence of the anomalous Nernst voltage on the density of heat flow. In this specific example, the insulating board 21 is formed of polyimide (flexible sheet) and has the size of 10 mm×10 mm, each fine line 22a of the thermoelectric generator 22 is formed of FeAl, and the number of fine lines 22a is ten. Furter, each fine line 23a of the connector 23 is formed of Au. The anomalous Nernst voltage is output even in the absence of an external magnetic field, and the function as a heat flux sensor that responds linearly to the given density of heat flow is shown.

The fine lines 22a and 23a of the thermoelectric generator 22 and the connector 23 are formed to have a thickness of, for example, in the order of several tens to several thousands of nm.

Since the above heat flux sensor 20 utilizes the anomalous Nernst effect, it is possible to detect heat flow utilizing residual magnetization even in the absence of an external magnetic field.

Details of Peltier Element with Heat Flux Sensor 100

In the Peltier element with a heat flux sensor 100 according to an embodiment of the present invention, the insulation substrate 12 of the Peltier element 10 is used as the insulating board 21 of the above heat flux sensor 20. This allows the anomalous Nernst heat flux sensor 20 to be prepared directly on the Peltier element 10.

In this case, the thermal resistance applied to the Peltier element 10 is only that of the metal thin film (the plurality of fine lines 22a and 23a) forming the thermoelectric generator 22 and the connector 23, so that their thermal resistance is extremely low, i.e., $10^{-8}$ to $10^{-10}$ $m^2K/W$, in the case where the thickness is approximately 0.1 to 10 μm. For this reason, the increase in thermal resistance caused by preparing the heat flux sensor 20 is extremely small, which does not affect the cooling/heating performance of the Peltier element 10 and makes it possible to detect heat flow at high speed. By utilizing the anomalous Nernst effect, a potential difference occurs in a direction perpendicular to the temperature difference, and therefore, it can be configured with a simpler structure as compared with those utilizing the Seebeck effect and can be easily prepared.

In the Peltier element with a heat flux sensor 100 according to the present invention, the configurations of the Peltier element 10 and the heat flux sensor 20 alone can be typically used, but the following configurations are favorable.

The pair of insulating boards 21 (insulation substrates 12) constituting the Peltier element with a heat flux sensor 100 according to an embodiment of the present invention may be either a ceramic board or a flexible sheet.

The magnetic material of the thermoelectric generator 22 according to an embodiment of the present invention is favorably any one of Fe—Al, Fe—Ga, Fe—Sn, Fe—Pt, Mn—Ga, Mn—Ge, Mn—Sn, Ni—Pt, Co—Gd, $Fe_4N$, $Mn_3AN$ (A=Mn, Pt, Ni), a $Co_2YZ$ (Y=Ti, V, Cr, Mn, Fe, Z=Ga, Ge, Al, Si, Sn, Sb) Heusler alloy, an Sm—Co permanent magnet material, an Nd—Fe—B permanent magnet material, an FePt $L1_0$ ordered alloy, an FePd $L1_0$ ordered alloy, and a CoPt $L1_0$ ordered alloy.

The non-magnetic material of the connector 23 according to an embodiment of the present invention is favorably any one of Cu, Ag, Au, Al, Rh, W, Mo, Pt, Pd, and an alloy material containing these.

The Peltier element with a heat flux sensor 100 according to an embodiment of the present invention may include a heat-dissipating fin on the heat generating surface of the Peltier element 10. Further, it may include a heat-dissipating fin on the anomalous Nernst heat flux sensor 20.

EXAMPLE

FIG. 4 is a perspective view of a configuration of an experimental device in which the anomalous Nernst heat flux sensor 20 is patterned on an upper part (outer surface 12a) of the Peltier element 10 showing Example of the present invention, showing measurement of the heat flow and temperature by a thermocouple attached to a copper plate. Note that FIG. 4 shows the state in which the heat-dissipating fin is detached. It is favorable to further attach a heat-dissipating fin onto the Peltier element.

As shown in FIG. 4, the anomalous Nernst heat flux sensor 20 using an Fe—Ga magnetic wire and an Au wire is directly patterned and formed on the ceramic plate of the commercially available Peltier element 10. Since the film thickness of Fe—Ga and Au is 50 nm, the increase in thermal resistance of the Peltier element 10 is extremely small, i.e., in the order of $10^{-10}$ m²K/W, which can be ignored. The prepared Peltier element with a heat flux sensor 100 was attached onto a copper plate via a heat dissipation sheet, and then, a thermocouple for monitoring a temperature was attached to the copper plate. A power source to the Peltier element 10 and a digital multimeter for measuring the voltage of the thermocouple and the heat flux sensor are wired.

FIGS. 5(A)-5(C) are diagrams showing a result of measuring the heat flow and temperature by a thermocouple attached to a copper plate when the anomalous Nernst heat flux sensor 20 is patterned on an upper part (outer surface 12a) of the Peltier element 10 showing Example of the present invention and the voltage input to the Peltier element 10 is changed.

Although the temperature of the copper plate is heated and cooled by the heat flow control by the Peltier element 10, the change thereof is detected slowly. Meanwhile, in the anomalous Nernst heat flux sensor 20, the sudden change in heat flow immediately after changing the voltage input to the Peltier element 10 is detected at extremely high speed with a response speed of less than one second. It has been demonstrated that the present invention allows heat flow fluctuations by the Peltier element 10 to be detected at high speed and accurately.

The Peltier element 10 is a rare device that is capable of performing both heating and cooling and is widely used in an air conditioner, an electronic apparatus, a camera, a medical device, and the like. The Peltier element 10 is a device that controls the heat flow by applying a current utilizing the thermoelectric effect. How much the heat flow is generated through the Peltier element 10 is generally estimated indirectly through the temperature of an object to be cooled or heated, and the heat flow of the Peltier element 10 itself is not directly measured, so that there is a limit to high-accuracy temperature control.

The present invention relates to a "Peltier element with an ultra-low thermal resistance heat flux sensor" that is capable of detecting heat flow passing through the Peltier element 10 at high speed by forming a thin-film type anomalous Nernst heat flux sensor 20 directly on the plate such as ceramics forming the Peltier element 10, which provides negligible thermal resistance.

Although several embodiments of the present invention have been described, these embodiments are presented as examples and are not intended to limit the scope of the invention. These novel embodiments can be implemented in various other forms, and various emissions, substitutions, and modifications can be made without departing from the gist of the present invention. These embodiments and modifications thereof are included within the scope and gist of the present invention, and are included in the scope of the invention described in the claims and equivalents thereof.

INDUSTRIAL APPLICABILITY

The Peltier element with a heat flux sensor 100 according to the present invention can be used in any application device that uses a Peltier element. For example, in a Peltier cooler, it is expected that temperature changes due to heat flow can be predicted more accurately and precise temperature control of less than 0.1° C. can be performed. In a thermal sensing device using a Peltier element, and the like, a high level of control is possible by causing the direction and magnitude of heat flow and temperature sensation of a human body to correspond to each other.

Note that the present invention may also take the following configurations.

[1] A Peltier element with a heat flux sensor, including:
  an anomalous Nernst heat flux sensor that is formed directly on at least one of a heat absorbing surface or a heat generating surface of the Peltier element.

[2] The Peltier element with a heat flux sensor according to [1] above, further including:
  a pair of insulation substrates having a pair of outer surfaces and a pair of inner surfaces, the pair of outer surfaces forming the heat absorbing surface and the heat generating surface, the pair of inner surfaces facing each other;
  a P-type element and an N-type element sandwiched between the pair of inner surfaces of the pair of insulation substrates;
  a pair of electrode patterns formed on the pair of inner surfaces of the pair of insulation substrates such that the P-type elements and the N-type element are alternately connected in series; and
  an electrode for external connection to be connected to one of the pair of electrode patterns.

[3] The Peltier element with a heat flux sensor according to [2] above, in which
  the pair of insulation substrates are either a ceramic board or a flexible sheet.

[4] The Peltier element with a heat flux sensor according to any one of [1] to [3] above, characterized by that
  the anomalous Nernst heat flux sensor includes
    a thermoelectric generator including a plurality of fine lines that is arranged along at least one of the heat absorbing surface or the heat generating surface, extends in a first direction, and is arranged parallel to each other along a second direction orthogonal to the first direction, and
    a connector configured to connect the plurality of fine lines in series such that a current flows through the plurality of fine lines in the same orientation in the first direction,

the thermoelectric generator is formed of a magnetic material having residual magnetization in the second direction, and the connector is formed of a magnetic material that has a Nernst coefficient of the same sign as that of the thermoelectric generator and has residual magnetization in a direction opposite to a residual magnetization direction of the thermoelectric generator, a non-magnetic material, or a magnetic material that has a Nernst coefficient with an opposite sign to that of the thermoelectric generator and has residual magnetization in the same direction as the residual magnetization direction of the thermoelectric generator.

[5] The Peltier element with a heat flux sensor according to [4] above, in which the magnetic material of the thermoelectric generator is any one of Fe—Al, Fe—Ga, Fe—Sn, Fe—Pt, Mn—Ga, Mn—Ge, Mn—Sn, Ni—Pt, Co—Gd, $Fe_4N$, $Mn_3AN$ (A=Mn, Pt, Ni), $Co_2YZ$ (Y=Ti, V, Cr, Mn, Fe, Z=Ga, Ge, Al, Si, Sn, Sb) Heusler alloy, an Sm—Co permanent magnet material, an Nd—Fe—B permanent magnet material, an FePt $L1_0$ ordered alloy, an FePd $L1_0$ ordered alloy, and a CoPt $L1_0$ ordered alloy.

[6] The Peltier element with a heat flux sensor according to [4] above, in which the non-magnetic material of the connector is any of Cu, Ag, Au, Al, Rh, W, Mo, Pt, Pd, and an alloy material containing these.

[7] The Peltier element with a heat flux sensor according to any one of [1] to [6] above, further comprising a heat-dissipating fin attached onto the anomalous Nernst heat flux sensor.

11N/11P N-type element/P-type element

12 insulation substrate

15 electrode pattern

18 wiring board for mounting a Peltier element

19 heat/cold module/Peltier element

20 thermoelectric power generation device/heat flux sensor

21 insulating board

22 thermoelectric generator (magnetic wire)

22a fine line

23 connector (ferromagnetic material, non-magnetic material)

23a fine line

100 Peltier element with a heat flux sensor

The invention claimed is:

1. A Peltier element with a heat flux sensor, comprising:

an upper insulating board comprising an upper outer surface and an upper inner surface opposite from the upper outer surface;

a lower insulating board comprising a lower outer surface and a lower inner surface opposite from the lower outer surface, the lower inner surface facing the upper inner surface;

a plurality of fine lines constituting an anomalous Nernst heat flux sensor is-formed directly on the upper outer surface or the lower outer surface or both;

N-type and P-type elements sandwiched between the upper insulating board and the lower insulating board, such that the upper insulating board, the lower insulating board, and the N-type and P-type elements form a Peltier element;

an upper electrode pattern formed on the upper inner surface; and a lower electrode pattern formed on the lower inner surface, wherein the upper electrode pattern and the lower electrode pattern are configured so that the N-type and P-type elements are alternately connected in series.

2. The Peltier element with a heat flux sensor according to claim 1, wherein an electrode provided on the lower inner surface and an electrode of the Peltier element are caused to abut on each other to be directly connected.

3. The Peltier element with a heat flux sensor according to claim 2, wherein each of the upper insulating board and the lower insulating board is either a ceramic board or a flexible sheet.

4. The Peltier element with a heat flux sensor according to claim 1, wherein the plurality of fine lines constituting the anomalous Nernst heat flux sensor include:

a thermoelectric generator including a plurality of first fine lines (22a) that are arranged parallel to each other to extend in a first direction (y direction) along a surface of the insulating board; and a connector including a plurality of second fine lines (23a) that are arranged parallel to the first fine lines (22a) of the thermoelectric generator and between the first fine lines (22a) along the surface of the insulating board, wherein each of the first fine lines (22a) of the thermoelectric generator is formed of a magnetic material having residual magnetization even in absence of an external magnetic field and is magnetized in the same direction in width direction of each of the first fine lines 22a of the thermoelectric generator, the width direction being a second direction (x direction) that is perpendicular to the first direction within the insulating boards, wherein each of the second fine lines (23a) of the connector electrically connects one end of the corresponding first fine line (22a) of the thermoelectric generator to another end of a first fine line (22a) adjacent to the corresponding first fine line (22a) on one side, and wherein the connector is formed of a magnetic material that is magnetized in a direction opposite to a direction of magnetization of each of the first fine lines (22a), a non-magnetic material, or a magnetic material that has a Nernst coefficient with an opposite sign to that of each of the first fine lines (22a).

5. The Peltier element with a heat flux sensor according to claim 4, wherein the magnetic material of the thermoelectric generator is any of Fe—Al, Fe—Ga, Fe—Sn, Fe—Pt, Mn—Ga, Mn—Ge, Mn—Sn, Ni—Pt, Co—Gd, $Fe_4N$, $Mn_3AN$ (A=Mn, Pt, Ni), a $Co_2YZ$ (Y=Ti, V, Cr, Mn, Fe, Z=Ga, Ge, Al, Si, Sn, Sb) Heusler alloy, an Sm—Co permanent magnet material, an Nd—Fe—B permanent magnet material, an FePt $L1_0$ ordered alloy, an FePd $L1_0$ ordered alloy, and a CoPt $L1_0$ ordered alloy.

6. The Peltier element with a heat flux sensor according to claim 4, wherein the non-magnetic material of the connector is any of Cu, Ag, Au, Al, Rh, W, Mo, Pt, Pd, and an alloy material containing any combination of these.

7. The Peltier element with a heat flux sensor according to claim 1, further comprising a heat-dissipating fin attached onto the heat flux sensor.

8. The Peltier element with a heat flux sensor according to claim 1, wherein the plurality of fine lines are formed directly throughout the upper outer surface or the lower outer surface or both.

* * * * *